United States Patent
Lee et al.

(10) Patent No.: US 9,112,010 B2
(45) Date of Patent: Aug. 18, 2015

(54) NITRIDE-BASED SEMICONDUCTOR DEVICE

(71) Applicant: SAMSUNG ELECTRONICS CO., LTD., Suwon-si, Gyeonggi-do (KR)

(72) Inventors: Jae-hoon Lee, Suwon-si (KR); Chan-ho Park, Seongnam-si (KR); Nam-young Lee, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/160,629

(22) Filed: Jan. 22, 2014

(65) Prior Publication Data

US 2014/0252369 A1    Sep. 11, 2014

(30) Foreign Application Priority Data

Mar. 8, 2013    (KR) .................. 10-2013-0025249

(51) Int. Cl.
| | |
|---|---|
| *H01L 29/778* | (2006.01) |
| *H01L 29/43* | (2006.01) |
| *H01L 29/66* | (2006.01) |
| *H01L 29/24* | (2006.01) |
| *H01L 29/20* | (2006.01) |
| *H01L 29/417* | (2006.01) |

(52) U.S. Cl.
CPC ............ *H01L 29/7787* (2013.01); *H01L 29/24* (2013.01); *H01L 29/432* (2013.01); *H01L 29/66462* (2013.01); *H01L 29/2003* (2013.01); *H01L 29/41766* (2013.01)

(58) Field of Classification Search
CPC .............. H01L 29/778; H01L 29/7787; H01L 29/7789
USPC ..................................... 257/183, 213
See application file for complete search history.

(56) References Cited

U.S. PATENT DOCUMENTS

| | | | |
|---|---|---|---|
| 6,982,204 B2 | 1/2006 | Saxler et al. | |
| 7,038,253 B2 | 5/2006 | Yoshida et al. | |
| 7,326,971 B2 | 2/2008 | Harris et al. | |
| 7,425,721 B2 * | 9/2008 | Teraguchi | 257/27 |
| 7,728,356 B2 | 6/2010 | Suh et al. | |
| 7,859,020 B2 | 12/2010 | Kikkawa et al. | |
| 7,898,002 B2 | 3/2011 | Hikita et al. | |
| 8,084,785 B2 * | 12/2011 | Briere | 257/194 |
| 8,129,748 B2 * | 3/2012 | Uemoto et al. | 257/192 |
| 2007/0132037 A1* | 6/2007 | Hoshi et al. | 257/396 |
| 2010/0320505 A1 | 12/2010 | Okamoto et al. | |
| 2011/0193096 A1 | 8/2011 | Imada | |
| 2011/0272741 A1 | 11/2011 | Hwang | |
| 2012/0061727 A1 * | 3/2012 | Lee et al. | 257/183 |
| 2012/0193688 A1 | 8/2012 | Lidow et al. | |
| 2013/0082336 A1* | 4/2013 | Imada | 257/409 |

FOREIGN PATENT DOCUMENTS

| | | |
|---|---|---|
| JP | 2010-263011 A | 11/2010 |
| JP | 2012-049216 A | 3/2012 |

(Continued)

*Primary Examiner* — David Vu
*Assistant Examiner* — Brandon Fox
(74) *Attorney, Agent, or Firm* — Lee & Morse, P.C.

(57) ABSTRACT

A nitride-based semiconductor device including a substrate; a GaN-containing layer on the substrate; a nitride-containing layer on the GaN layer; a channel blocking layer on the nitride-containing layer, the channel blocking layer including a nitride-based semiconductor; a gate insulation layer on the channel blocking layer; and a gate electrode on the gate insulation layer.

18 Claims, 8 Drawing Sheets

(56) References Cited

FOREIGN PATENT DOCUMENTS

| | | | |
|---|---|---|---|
| JP | 2012-054348 A | 3/2012 | |
| JP | 2012-094746 A | 5/2012 | |
| KR | 10-2010-0034919 A | 4/2010 | |

* cited by examiner

NITRIDE-BASED SEMICONDUCTOR DEVICE

CROSS-REFERENCE TO RELATED APPLICATION

Korean Patent Application No. 10-2013-0025249, filed on Mar. 8, 2013, in the Korean Intellectual Property Office, and entitled: "Nitride-Based Semiconductor Device," is incorporated by reference herein in its entirety.

BACKGROUND

1. Field

Embodiments relate to a nitride-based semiconductor device.

2. Description of the Related Art

In a power converting system, efficiency of the entire power converting system may depend on efficiency of a power switching device. As a switching device, a silicon (Si) based power metal oxide semiconductor field effect transistor (MOSFET) or insulated gate bipolar transistor (IGBT) may be used.

SUMMARY

Embodiments are directed to a nitride-based semiconductor device.

The embodiments may be realized by providing a nitride-based semiconductor device including a substrate; a GaN-containing layer on the substrate; a nitride-containing layer on the GaN-containing layer; a channel blocking layer on the nitride-containing layer, the channel blocking layer including a nitride-based semiconductor; a gate insulation layer on the channel blocking layer; and a gate electrode on the gate insulation layer.

The channel blocking layer may be formed of $Mg_xC_{1-x}N$, in which $0 \leq x \leq 1$.

The channel blocking layer may have negative (−) charges and may block a channel below the gate electrode via charge neutrality.

The GaN-containing layer may include a semi-insulating layer and a channel layer.

The semi-insulating layer may be a GaN layer having a high resistance, and the channel layer may be a doped GaN layer.

The nitride-based semiconductor device may further include a buffer layer on the substrate.

The substrate may be formed of Si, $Al_2O_3$, SiC, AlN, or GaN.

The gate insulation layer may be formed of $Al_2O_3$.

The nitride-based semiconductor device may further include a first insulation layer on the nitride-containing layer at two opposite sides of the channel blocking layer, the first insulation layer including $SiO_x$ or $SiN_x$.

The gate insulation layer may be on the channel blocking layer and the first insulation layer.

The nitride-based semiconductor device may further include a second insulation layer on the gate insulation layer at two opposite sides of the gate electrode, the second insulation layer including $SiO_x$ or $SiN_x$.

The nitride-based semiconductor device may further include source/drain electrodes, the source/drain electrodes being arranged apart from two opposite sides of the gate electrode, penetrating through the nitride-containing layer, and forming an ohmic contact with a 2-dimensional electron gas in the GaN-containing layer.

The embodiments may also be realized by providing a nitride-based semiconductor device including a substrate; a buffer layer on the substrate; a GaN-containing layer on the buffer layer; a nitride-containing layer on the GaN-containing layer; a channel blocking layer on the nitride-containing layer, the channel blocking layer including a nitride-based semiconductor; a first insulation layer on the nitride-containing layer at two opposite sides of the channel blocking layer; a gate insulation layer on the channel blocking layer and the first insulation layer; a gate electrode on the gate insulation layer; a second insulation layer on the gate insulation layer at two opposite sides of the gate electrode; and source/drain electrodes, the source/drain electrodes being arranged apart from two opposite sides of the gate electrode, penetrating through the nitride-containing layer, and forming an ohmic contact with a 2-dimensional electron gas in the GaN-containing layer The channel blocking layer may be formed of $Mg_xC_{1-x}N$, in which $0 \leq x \leq 1$.

The GaN-containing layer may include a semi-insulating layer formed as a GaN layer having a high resistance, and a channel layer formed as a doped GaN layer, wherein the gate insulation layer may be formed of $Al_2O_3$, and wherein the first insulation layer and the second insulation layer may be formed of $SiO_x$ or $SiN_x$.

The embodiments may also be realized by providing a nitride-based semiconductor device including a substrate; a semi-insulating layer on the substrate; a channel layer on the semi-insulating layer; a nitride-containing layer on the channel layer; a channel blocking layer on the nitride-containing layer, the channel blocking layer including a nitride-based semiconductor; a gate insulation layer on the channel blocking layer; and a gate electrode on the gate insulation layer.

The device may maintain a normally OFF state.

The nitride-containing layer may include a semiconductor material having a different band gap from that of the channel layer The channel layer may include a material that forms a 2-dimensional electron gas.

The channel blocking layer may be formed of $Mg_xC_{1-x}N$, in which $0 \leq x \leq 1$.

BRIEF DESCRIPTION OF THE DRAWINGS

Features will be apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

As used herein, the term "and/or" includes any and all combinations of one or more of the associated listed items.

It will be understood that when a component is referred to as being "connected" to another component, it can be directly connected to the other component, or intervening components may also be present. Similarly, it will also be understood that when a layer is referred to as being "on" another layer or substrate, it can be directly on the other layer or substrate, or intervening layers may also be present. In the drawings, the thicknesses of layers and regions are exaggerated for clarity, and portions and components irrelevant to descriptions below are omitted. Like reference numerals in the drawings denote like elements. Meanwhile, the terms used in the present specification are merely used to describe particular embodiments, and are not intended to limit the inventive concept.

Figure 1:
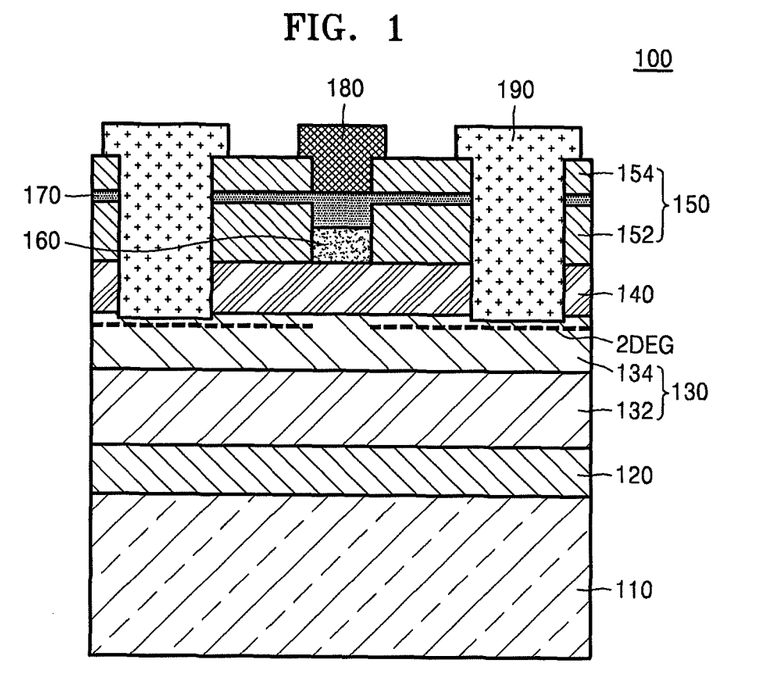
FIG. 1 illustrates a sectional view of a nitride-based semiconductor device according to an embodiment.

FIG. 1 illustrates a sectional view of a nitride-based semiconductor device 100 according to an embodiment.

Referring to FIG. 1, the nitride-based semiconductor device 100 according to the present embodiment may include a substrate 110, a buffer layer 120, a GaN-containing layer 130, an AlGaN-containing layer, e.g., a nitride-containing layer 140, an insulation layer 150, a channel blocking layer 160, a gate insulation layer 170, a gate electrode 180, and source/drain electrodes 190.

The substrate 110 may be an insulating substrate, e.g., a glass substrate or a sapphire ($Al_2O_3$) substrate. The substrate 110 may be a nitride-growing substrate, e.g., an aluminum nitride (AlN) substrate or a gallium nitride (GaN) substrate.

The buffer layer 120 may be arranged on the substrate 110. The buffer layer 120 may be arranged to help prevent deterioration of crystallinity of the GaN-containing layer 130 by reducing differences between lattice constants and thermal expansion coefficients of the substrate 110 and the GaN-containing layer 130. The buffer layer 120 may have a single-layer structure or a multi-layer structure, and may include one or more materials selected from nitrides of Al, Ga, In, or B. For example, a material constituting the buffer layer 120 may be expressed as $Al_xIn_yGa_{1-x-y}N$ ($0 \leq x \leq 1$, $0 \leq y \leq 1$, $x+y \leq 1$). In an implementation, the buffer layer 120 may have a single-layer structure or a multi-layer structure, and may include at least one of AlN, GaN, AlGaN, InGaN, AlInN, AlGaInN, or the like.

If desired, a predetermined seed layer (not shown) may be further arranged between the substrate 110 and the buffer layer 120. The seed layer may be a base layer for growing the buffer layer 120. In an implementation, the substrate 110 and the buffer layer 120 may be removed after a semiconductor device is fabricated. For example, in a nitride-based semiconductor device according to the present embodiment, the substrate 110 and the buffer layer 120 may be selectively arranged.

The GaN-containing layer 130 may be arranged on the buffer layer 120.

The GaN-containing layer 130 may include a semi-insulating layer 132 and a channel layer 134.

The semi-insulating layer 132 may be formed as, may be, or may include a GaN layer having a high resistance for raising breakdown voltage of a semiconductor device. The GaN layer having a high resistance may be an undoped GaN layer. The semi-insulating layer 132 may have a relatively high resistance to help prevent a leakage current toward the substrate 110 and for isolation of a semiconductor device. The semi-insulating layer 132 may have a high resistance sufficient to be semi-insulating. For example, the semi-insulating layer 132 may have a resistance of about $10^7 \sim 10^{11}$ $\Omega/cm^2$.

To help increase insulation of the semi-insulating layer 132, crystallinity of the semi-insulating layer 132 may be deteriorated by increasing defects by, e.g., growing the semi-insulating layer 132 at a low temperature, or resistance of the semi-insulating layer 132 may be increased by adding an impurity, e.g., Mg, C, Fe, or the like, thereto.

The semi-insulating layer 132 may be formed via, e.g., metal-organic chemical vapor deposition (MOCVD), molecular beam epitaxy (MBE), hydride vapor phase epitaxy (HVPE), sputtering, or the like.

The channel layer 134 may be a layer that forms a channel between the source/drain electrodes 190 and may be a single layer or a multi-layer formed of a semiconductor. The channel layer 134 may be a doped GaN layer. For example, the channel layer 134 may be a layer doped with an n-type impurity. Here, the n-type impurity may include Si, Ge, or Sn. The n-type impurity may be doped at a concentration less than $10^{18}$ atom/$cm^3$, e.g., a concentration about $10^{17}$ atom/$cm^3$. In an implementation, the channel layer 134 may be a GaN layer doped with Al. Here, Al may be doped at a concentration less than or equal to 1%, and the GaN layer doped with Al may be grown by using suitable methods, e.g., the methods of forming of the semi-insulating layer 132.

Although a case where the channel layer 134 is a doped GaN layer is given above, the embodiments are not limited thereto. For example, a material constituting the channel layer 134 may be expressed as $Al_xIn_yGa_{1-x-y}N$ ($0 \leq x \leq 1$, $0 \leq y \leq 1$, $x+y \leq 1$). In an implementation, the channel layer 134 may include, e.g., AlN, GaN, InN, InGaN, AlGaN, AlInN, AlInGaN, or the like.

In an implementation, the channel layer 134 may include suitable materials other than the materials stated above, as long as a 2-dimensional electron gas (2DEG) may be formed therein. The channel layer 134 may be a layer doped with a predetermined impurity as described above or may be an undoped layer. For example, the channel layer 134 may be an undoped GaN layer. A thickness of the channel layer 134 may be less than or equal to hundreds of nm.

The nitride-containing layer 140 may be formed on the GaN-containing layer 130.

The nitride-containing layer 140 may include a material (semiconductor) having a different band gap from that of the channel layer 134. For example, the nitride-containing layer 140 may include a material (semiconductor) having a band gap greater than that of the channel layer 134. For example, the nitride-containing layer 140 may have a single layer structure or a multi-layer structure including one or more materials selected from among nitrides containing at least one from among Al, Ga, and In.

A material constituting the nitride-containing layer 140 may be expressed as $Al_xIn_yGa_{1-x-y}N$ (0≤x≤1, 0≤y≤1, x+y≤1). For example, the nitride-containing layer 140 may have a single layer structure or a multi-layer structure containing at least one of AlN, GaN, InN, InGaN, AlGaN, AlInN, AlInGaN, or the like A material constituting the nitride-containing layer 140 may be expressed as $Al_xGa_{1-x}N$ (0≤x≤0.6 or 0.1≤x≤0.5). An amount of Al in the nitride-containing layer 140 may be less than or equal to 60 at %, e.g., from 10 at % to 40 at %. The nitride-containing layer 140 may be a doped with a n-type impurity. The n-type impurity may include, e.g., Si, Ge, or Sn. The n-type impurity may be doped at a concentration from about $10^{18}$ atom/cm$^3$ to about $10^{20}$ atom/cm$^3$.

The nitride-containing layer 140 may be a layer doped with a predetermined impurity as described above. However, if desired, the nitride-containing layer 140 may be an undoped layer. A thickness of the nitride-containing layer 140 may be less than or equal to dozens of nm. For example, thickness of the nitride-containing layer 140 may be from about 10 nm to about 50 nm or from about 20 nm to about 30 nm.

In a hetero junction structure between the channel layer 134 and the nitride-containing layer 140 having different energy band gaps, electrons may be highly concentrated at an interface between the channel layer 134 and the nitride-containing layer 140 due to large band-discontinuity at the interface. Therefore, 2DEG may be formed in a portion of the channel layer 134. As indicated with a dotted line, the 2DEG may be formed in the portion of the channel layer 134 below the interface between the channel layer 134 and the nitride-containing layer 140.

As described above, a 2DEG formed in the channel layer 134 may be used as a current path between the source/drain electrodes 190, e.g., a channel.

The channel blocking layer 160 may be formed on the nitride-containing layer 140. The channel blocking layer 160 may block a channel therebelow via charge neutrality. To block a channel therebelow, the channel blocking layer 160 may be formed of a material having negative (−) charges. For example, a material constituting the channel blocking layer 160 may be expressed as $Mg_xC_{1-x}N$ (0≤x≤1). In an implementation, the channel blocking layer 160 may be formed of MgCN, MgN, CN, or the like.

In the nitride-based semiconductor device 100 according to the present embodiment, the channel blocking layer 160 may be formed of MgCN. The MgCN channel blocking layer 160 may be formed via MOCVD, MBE, HVPE, sputtering, or the like. A thickness of the MgCN channel blocking layer 160 may be from about 1 nm to about 100 nm.

In FIG. 1, a dotted line representing the 2DEG is broken to indicate that the 2DEG may be blocked by the channel blocking layer 160, and thus a channel may be blocked. As the channel is blocked, the nitride-based semiconductor device 100 according to the present embodiment may maintain a normally OFF state. Blockage of a channel by the channel blocking layer 160 will be described below in greater detail with reference to FIG. 2.

A first insulation layer 152 may be formed on portions of the nitride-containing layer 140 at two opposite sides of the channel blocking layer 160. The first insulation layer 152 may be formed of $SiO_x$ or $SiN_x$. In an implementation, the first insulation layer 152 may be formed of $SiO_x$. The first insulation layer 152 may be formed via a high-temperature deposition at a temperature equal to or above 1,000° C., where, during the formation of the first insulation layer 152, a surface of the nitride-containing layer 140 may be further stabilized.

The gate insulation layer 170 may be formed on the channel blocking layer 160 and the first insulation layer 152. The gate insulation layer 170 may include at least one of, e.g., $Al_2O_3$, $SiO_x$, $Si_xN_y$, $Sc_2O_3$, AlN, $Ga_2O_3$, $Gd_2O_3$, $Al_xGa_{2(1-x)}O_3$, MgO, or combinations thereof. In an implementation, the gate insulation layer 170 may be formed of a suitable materials for forming gate insulation layers in transistors.

In the nitride-based semiconductor device 100 according to the present embodiment, the gate insulation layer 170 may be formed of $Al_2O_3$. The $Al_2O_3$ gate insulation layer 170 may be formed via atomic layer deposition (ALD), and a thickness thereof may be from about 20 nm to about 50 nm.

The gate electrode 180 may be formed on a portion of the gate insulation layer 170 corresponding to the channel blocking layer 160. The gate electrode 180 may be formed of one or more of Ni, Al, Ti, TiN, Pt, Au, $RuO_2$, V, W, WN, Hf, HfN, Mo, NiSi, $CoSi_2$, WSi, PtSi, Ir, Zr, Ta, TaN, Cu, Ru, Co.

If the gate insulation layer 170 is formed, it may not be necessary for the gate electrode 180 to form a Schottky contact with the nitride-containing layer 140 or the channel blocking layer 160. Therefore, a greater variety of materials (conductors) may be used for forming the gate electrode 180, as compared to a case where Schottky contact is used.

A second insulation layer 154 may be formed on portions of the gate insulation layer 170 at two opposite sides of the gate electrode 180. The second insulation layer 154 may be formed of $SiO_x$ or $SiN_x$. According to the present embodiment, the second insulation layer 154 may be formed of $SiN_x$. The second insulation layer 154 may help increase breakdown voltage of a semiconductor device.

Materials and structures of the first insulation layer 152 and the second insulation layer 154 may be similar to those of each other. Thus, the first insulation layer 152 and the second insulation layer 154 will be referred to as the insulation layer 150 unless it is necessary to distinguish one from the other.

The source/drain electrodes 190 may be formed to penetrate through the second insulation layer 154, the gate insulation layer 170, the first insulation layer 152, and the nitride-containing layer 140 and contact the 2DEG in the channel layer 134. The source/drain electrodes 190 may each be formed of or include, e.g., Ni, Al, Ti, TiN, Pt, Au, $RuO_2$, V, W, WN, Hf, HfN, Mo, NiSi, $CoSi_2$, WSi, PtSi, Ir, Zr, Ta, TaN, Cu, Ru, Co, or combinations thereof. In the nitride-based semiconductor device 100 according to the present embodiment, the source/drain electrodes 190 may be formed by forming an ohmic contact between metals, such as Ta/Al/W/TiN, and the channel layer 134 and annealing the structure at a temperature from about 500° C. to about 550° C. Alternatively, the source/drain electrodes 190 may be formed of Ta/Al/Ni/Au.

As described above, 2DEG may be formed at the interface between the nitride-containing layer 140 and the channel layer 134, and the 2DEG may be used as a channel. For example, a heterostructure field effect transistors (HFET) may use a AlGaN/GaN hetero junction structure, like the nitride-based semiconductor device 100 according to the present embodiment. Here, characteristics of such a HFET using a hetero junction structure will be briefly described below.

A GaN-based semiconductor may have excellent material properties including large energy gap, high thermal/chemical stability, and high electron saturation speed (about 3×10$^7$ cm/sec). Therefore, a GaN-based semiconductor may be easily applied not only to an optical devices, but also high frequency/high power electronic devices, and researches are being actively made thereon in the world. For example, an electronic device using a GaN-based nitride-based semiconductor may have various merits including high breakdown electric field (about 3×10⁶ V/cm), high maximum current density, stable operation at a high temperature, high thermal conductivity, and the like. For example, in a HFET having a AlGaN/GaN hetero junction structure features, due to large band discontinuity at the junction interface, high electron concentration may be maintained at the interface, and thus electron mobility may be further increased. Based on such material properties, a HFET having a AlGaN/GaN may be applied as a high-power device.

Electric resistance to a GaN-based product may be less than or equal to 1/100 of that of a Si-based product, and thus may be highly energy-efficient. Furthermore, a GaN-based product may feature high 'response' for fine-controlling currents and may be advantageous for reducing sizes and weights of peripheral components. However, in case of a AlGaN/GaN hetero-junction, a 2DEG may be formed. Therefore, a GaN-based product may be normally ON, and thus the GaN-based product may consume power. Accordingly, a MOS structure, which is normally OFF by removing an AlGaN layer by recessing the bottom portion of a gate electrode, may be used. However, in a structure from which an AlGaN layer is removed, it may be difficult to precisely control thickness of the AlGaN layer. Therefore, ON resistance may not be constant, and threshold voltage Vth may fluctuate. As a result, reproducibility may be deteriorated.

In the nitride-based semiconductor device 100 according to the present embodiment, the portion of the nitride-containing layer 140 below the gate electrode 180 may be maintained without being etched, and a normally OFF state may be achieved by using the channel blocking layer 160. Therefore, simplification and reproducibility of processes may be improved, and ON resistance and a threshold voltage may be uniformly maintained.

Figure 2:
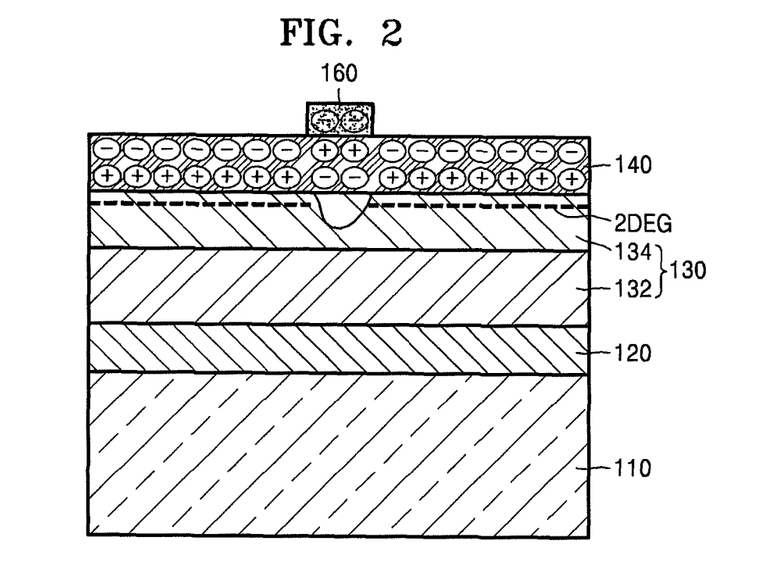
FIG. 2 illustrates a diagram showing the normally OFF mechanism in the nitride-based semiconductor device of FIG. 1.

FIG. 2 illustrates a diagram showing the normally OFF mechanism in the nitride-based semiconductor device 100 of FIG. 1.

Referring to FIG. 2, in the nitride-based semiconductor device 100, the channel blocking layer 160 may be arranged below the gate electrode 180. As described above, the channel blocking layer 160 may be formed of MgCN. In an implementation, the channel blocking layer 160 may be formed of, e.g., MgN or CN. As shown in FIG. 2, the MgCN channel blocking layer 160 may have negative (−) electric charges.

Due to the negative (−) charges of the channel blocking layer 160, charges may be reorganized in a bottom portion of the channel blocking layer 160 corresponding to the nitride-containing layer 140 to form or achieve charge neutrality. Therefore, positive (+) charges may be changed to negative (−) charges in a portion of the interface between the channel layer 134 and the nitride-containing layer 140 corresponding to the channel blocking layer 160. The charges at the interface may push out electrons in a channel formed by a 2DEG and may form a depletion region. In FIG. 2, the depletion region is indicated by a solid line. Formation of the depletion region may block a channel formed by a 2DEG. Therefore, the nitride-based semiconductor device 100 according to the present embodiment may maintain in a normally OFF state.

Figure 3:
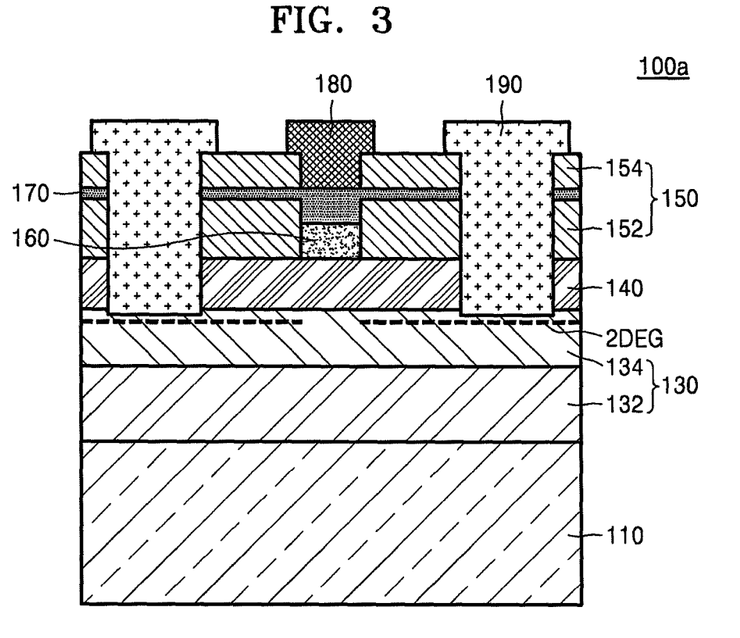
FIG. 3 illustrates a sectional view of a nitride-based semiconductor device according to another embodiment.

FIG. 3 illustrates a sectional view of a nitride-based semiconductor device 100a according to another embodiment. For convenience of explanation, repeated descriptions already given above with reference to FIG. 1 may be either briefly given or omitted.

Referring to FIG. 3, the nitride-based semiconductor device 100a according to the present embodiment may be similar to the nitride-based semiconductor device 100 of FIG. 1, except that there may be no buffer layer in the nitride-based semiconductor device 100a. As described above, in the nitride-based semiconductor device 100 of FIG. 1, the buffer layer 120 may help reduce differences between lattice constants and thermal expansion coefficients of the substrate 110 and the GaN-containing layer 130. Therefore, if there are little or no differences between lattice constants and thermal expansion coefficients of the substrate 110 and the GaN-containing layer 130, a buffer layer may be omitted as in the present embodiment. For example, if the substrate 110 is based on GaN, a buffer layer may be omitted.

In the nitride-based semiconductor device 100a according to the present embodiment, the channel blocking layer 160 may be formed on a portion of the nitride-containing layer 140 corresponding to the gate electrode 180 to maintain a normally OFF state of a channel. As described above, the channel blocking layer 160 may be formed of a material having electrically negative (−) charges, e.g., MgCN, MgN, CN, or the like.

Figure 4:
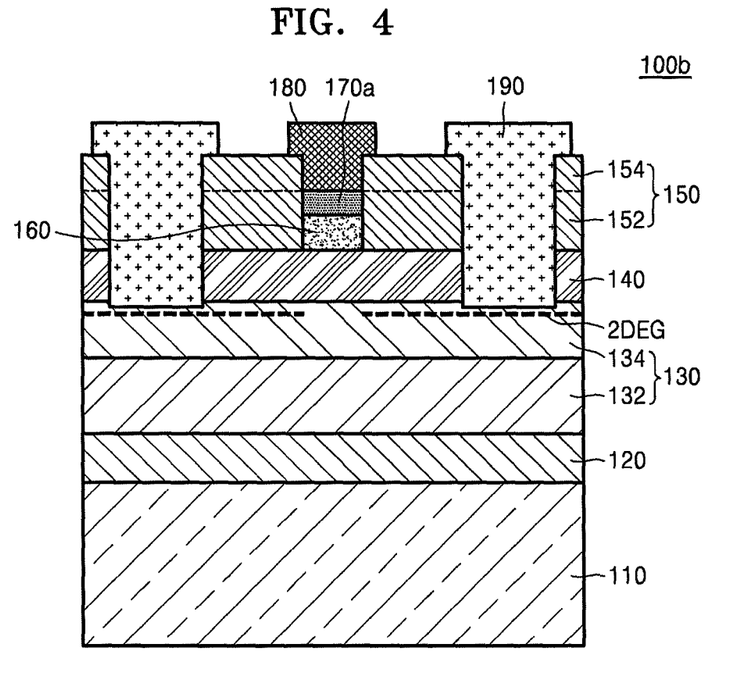
FIG. 4 illustrates a sectional view of a nitride-based semiconductor device according to another embodiment.

FIG. 4 illustrates a sectional view of a nitride-based semiconductor device 100b according to another embodiment. For convenience of explanation, repeated descriptions already given above with reference to FIG. 1 may be either briefly given or omitted.

Referring to FIG. 4, the nitride-based semiconductor device 100b according to the present embodiment may be similar to the nitride-based semiconductor device 100 of FIG. 1, except that structure of a gate insulation layer 170a may be different from that of the gate insulation layer 170 of FIG. 1.

In the nitride-based semiconductor device 100b, the gate insulation layer 170a may only be arranged below the gate electrode 180. Therefore, the gate insulation layer 170a may not be formed between the first insulation layer 152 and the second insulation layer 154. Furthermore, the source/drain electrodes 190 may be formed to penetrate through the second insulation layer 154, the first insulation layer 152, and the nitride-containing layer 140 and contact the channel layer 134.

In an implementation, as described above, the gate insulation layer 170a may be formed of, e.g., Al₂O₃. In an implementation, the first insulation layer 152 and the second insulation layer 154 may be formed of $SiO_x$ or $SiN_x$, e.g., the first insulation layer 152 and the second insulation layer 154 may be formed of a same material or different materials from each other. For example, the first insulation layer 152 may be formed of $SiO_x$ and the second insulation layer 154 may be formed of $SiN_x$, or vice versa. In an implementation, both the first insulation layer 152 and the second insulation layer 154 may be formed of $SiO_x$ or $SiN_x$. If the first insulation layer 152 and the second insulation layer 154 are formed of a same material, the first insulation layer 152 and the second insulation layer 154 may constitute the insulation layer 150 without being distinguished from each other.

In the nitride-based semiconductor device 100b according to the present embodiment, the channel blocking layer 160 may be formed between the gate insulation layer 170a and the nitride-containing layer 140 to maintain a normally OFF state of a channel.

Figure 5:
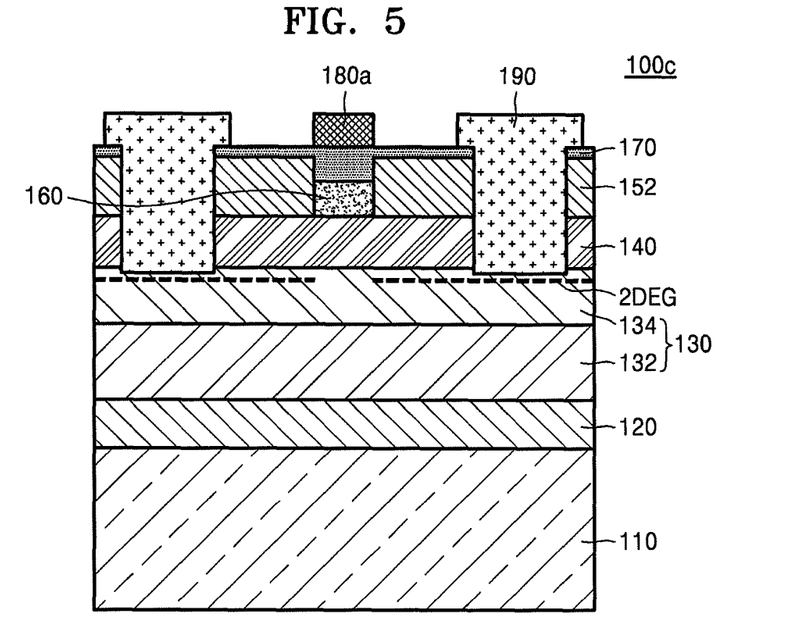
FIG. 5 illustrates a sectional view of a nitride-based semiconductor device according to another embodiment.

FIG. 5 illustrates a sectional view of a nitride-based semiconductor device 100c according to another embodiment. For convenience of explanation, repeated descriptions already given above with reference to FIG. 1 may be either briefly given or omitted.

Referring to FIG. 5, the nitride-based semiconductor device 100c according to the present embodiment is similar to the nitride-based semiconductor device 100 of FIG. 1, except that the nitride-based semiconductor device 100c may not include a second insulation layer.

In the nitride-based semiconductor device 100c according to the present embodiment, only the gate electrode 180 may be formed on the gate insulation layer 170, and no second insulation layer may be formed thereon. Therefore, only the first insulation layer 152 may be formed on the nitride-containing layer 140 at two opposite sides of the channel blocking layer 160. Furthermore, unlike the structure of the gate electrode 180 in the previous embodiments, a gate electrode 180a may have a structure in which width of the upper portion is identical to width of the lower portion.

The source/drain electrodes 190 may be formed to penetrate through the gate insulation layer 170 and the first insulation layer 152 and contact the channel layer 134.

Figure 6:
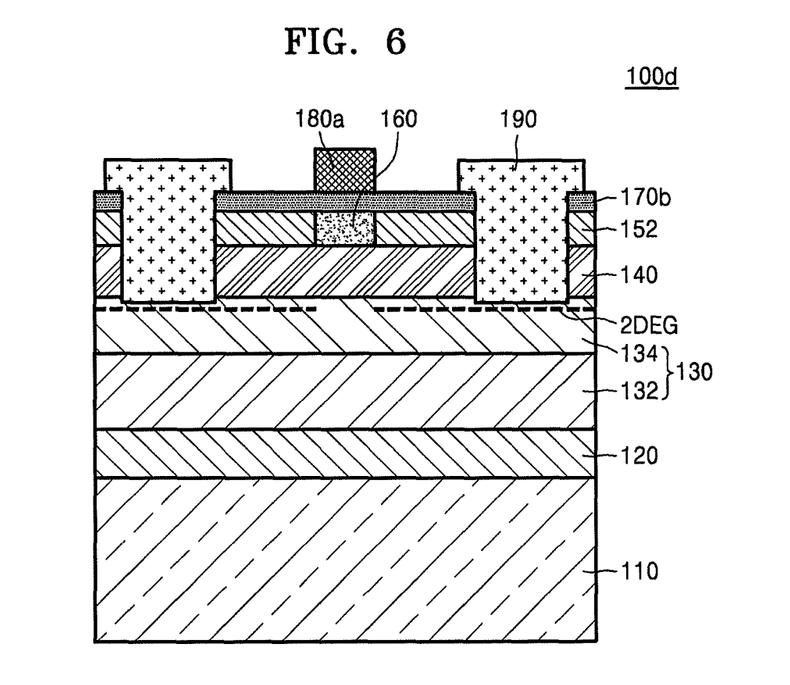
FIG. 6 illustrates a sectional view of a nitride-based semiconductor device according to another embodiment.

FIG. 6 illustrates a sectional view of a nitride-based semiconductor device 100d according to another embodiment. For convenience of explanation, repeated descriptions already given above with reference to FIGS. 1 through 5 may be either briefly given or omitted.

Referring to FIG. 6, the nitride-based semiconductor device 100d according to the present embodiment is similar to the nitride-based semiconductor device 100c of FIG. 5, except that the structure of a gate insulation layer 170b may be different from that of the gate insulation layer 170 of FIG. 5.

In the nitride-based semiconductor device 100d according to the present embodiment, the gate insulation layer 170b may be formed on the channel blocking layer 160 and the first insulation layer 152 and may have a uniform thickness. For example, in the nitride-based semiconductor devices 100 through 100c, a portion of the gate insulation layer 170 below the gate electrode 180 may be thicker than the remaining portion of the gate insulation layer 170. In the nitride-based semiconductor device 100d according to the present embodiment, the gate insulation layer 170b may have a uniform thickness regardless of the gate electrode 180.

In an implementation, the gate insulation layer 170b may have a uniform thickness and may be formed at a same level in the nitride-based semiconductor device 100d. In an implementation, the gate insulation layer 170b may have a uniform thickness, but may be recessed downward below a gate electrode 180a. When the gate insulation layer 170b has the recessed-downward structure, the gate electrode 180a may have a T-shaped structure, in which width of the upper portion is greater than width of the lower portion.

As shown in FIG. 6, the gate electrode 180a may have a structure in which width of the upper portion is identical to width of the lower portion. Like the nitride-based semiconductor device 100c of FIG. 5, no second insulation layer may be formed on the gate insulation layer 170b in the nitride-based semiconductor device 100d according to the present embodiment. Alternatively, like the nitride-based semiconductor devices 100, 100b, and 100c, of FIGS. 1, 3, and 4, a second insulation layer may be further formed on the gate insulation layer 170b at two opposite sides of the gate electrode 180a. Like the gate electrode 180 of FIGS. 1, 3, and 4, if a second insulation layer is formed, the gate electrode 180a may have a T-shaped structure, in which width of the upper portion is greater than width of the lower portion.

Figure 7:
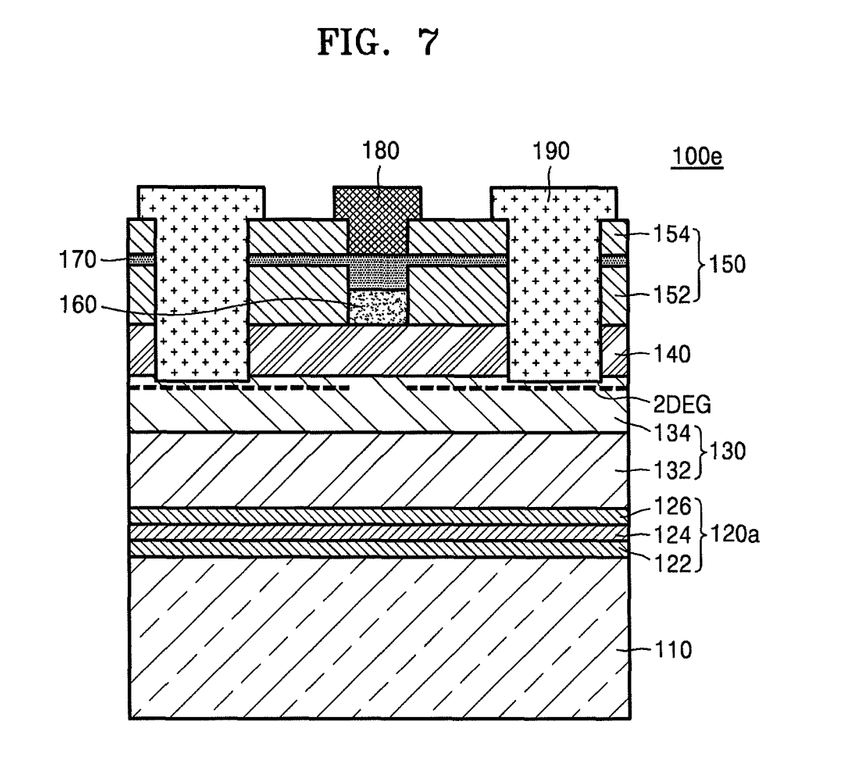
FIG. 7 illustrates a sectional view of a nitride-based semiconductor device according to another embodiment.

FIG. 7 illustrates a sectional view of a nitride-based semiconductor device 100e according to another embodiment. For convenience of explanation, repeated descriptions already given above with reference to FIG. 1 may be either briefly given or omitted.

Referring to FIG. 7, the nitride-based semiconductor device 100e according to the present embodiment is similar to the nitride-based semiconductor device 100 of FIG. 1, except that structure of a buffer layer 120a may be different from that of the buffer layer 120 of FIG. 1.

In the nitride-based semiconductor device 100e according to the present embodiment, the buffer layer 120a may be formed as a multi-layer. For example, the buffer layer 120a may include a first buffer layer 122, a stuffing layer 124, and a second buffer layer 126. The first buffer layer 122, the stuffing layer 124, and the second buffer layer 126 may help effectively prevent Si diffusion when the substrate 110 is formed based on Si.

For example, the first buffer layer 122 may be formed of AlN, AlGaN, low temperature (LT)-AlN, LT-GaN, $HfN_x$, $SiN_x$, MnS, or the like. or a refractory metal nitride, such as TiN, TaN, and WN, where thickness of the first buffer layer 122 may be from about 3 nm to about 1 µm.

The stuffing layer 124 may have a hexagonal or cubic structure, and may be formed of a material that forms an alloy with Si or a material having a lattice constant different from that of the first buffer layer 122. Examples of materials that may form alloys with Si may include Ru, Pd, and Ti. In an implementation, a material having a lattice constant different from that of the first buffer layer 122 may be used to form the stuffing layer 124, even if the material does not form an alloy with Si. A thickness of the stuffing layer 124 may be from about 3 nm to about 1 µm.

The stuffing layer 124 may help prevent Si diffusion to the GaN-containing layer 130 by forming an alloy with Si diffused from the substrate 110 or elongating a Si diffusion path.

The second buffer layer 126 may be formed of a material that may easily wet a GaN layer crystal-grown thereon and improving generation of GaN cores. For example, the second buffer layer 126 may be formed of AlN, AlGaN, LT-AlN, LT-GaN, $HfN_x$, $SiN_x$, MnS, or the like, or a refractory metal nitride, such as TiN, TaN, and WN. A thickness of the second buffer layer 126 may be from about 3 nm to about 1 µm, and the second buffer layer 126 may have a lattice constant different from that of the stuffing layer 124.

In an implementation, the buffer layer 120a may include three layers, or the buffer layer 120a may include two layers or four or more layers. Furthermore, based on desired characteristics of a nitride-based semiconductor device, a buffer layer having a super lattice structure including hundreds of layers may be employed.

FIGS. 8A through 8F illustrate sectional diagrams of stages in a method of fabricating a nitride-based semiconductor device as shown in FIG. 1. For convenience of explanation, repeated descriptions already given above with reference to FIG. 1 may be either briefly given or omitted.

Figure 8A:
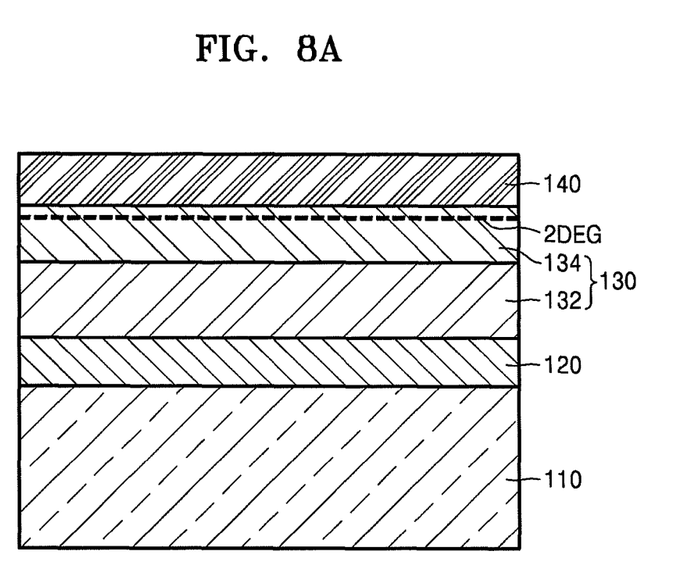
FIGS. 8A through 8F illustrate sectional diagrams showing stages in a method of fabricating a nitride-based semiconductor device as shown in FIG. 1.

Referring to FIG. 8A, the buffer layer 120, the GaN-containing layer 130, and the nitride-containing layer 140 may be stack-formed on the substrate 110 in the order stated. As described above, the substrate 110 may be formed of Si, $Al_2O_3$, SiC, AlN, or GaN. As described above, the buffer layer 120 may help reduce differences between lattice constants and thermal expansion coefficients of the substrate 110 and the GaN-containing layer 130.

The GaN-containing layer 130 may include the semi-insulating layer 132 and the channel layer 134, where the semi-insulating layer 132 may be formed as a GaN layer having a high resistance for raising breakdown voltage of a semiconductor device. The GaN layer having a high resistance may be an undoped GaN layer. In an implementation, resistance of the semi-insulating layer 132 may be increased by increasing defects by growing the GaN layer at a low temperature, or resistance of the GaN layer may be increased by adding an impurity, e.g., Mg, C, Fe, or the like, thereto. The semi-insulating layer 132 may be formed via MOCVD, MBE, HVPE, sputtering, or the like.

The channel layer 134 may be formed as a doped GaN layer. For example, the channel layer 134 may be a GaN layer doped with an n-type impurity. In an implementation, the n-type impurity may be Si, Ge, or Sn. The channel layer 134 may be formed via any of various methods like as the semi-insulating layer 132.

The nitride-containing layer 140 may include a material (semiconductor) having a different band gap from that of the channel layer 134. For example, the nitride-containing layer 140 may include a material having a band gap greater than that of the channel layer 134. In an implementation, the nitride-containing layer 140 may have a single layer structure or a multi-layer structure including one or more materials selected from nitrides containing at least one from among Al, Ga, and In. An amount of Al in the nitride-containing layer 140 may be about 10 at % to about 40 at %. The thickness of the nitride-containing layer 140 may be about 10 nm to about 50 nm, e.g., about 20 nm to about 30 nm.

As described above, although a 2DEG may be formed at the interface between the nitride-containing layer 140 and the channel layer 134, and the 2DEG may be used as a channel, it may result in a normally ON state. Thus, power may be consumed thereby. To indicate normally ON state, a dotted line indicating a 2DEG is continuous overall.

Figure 8B:
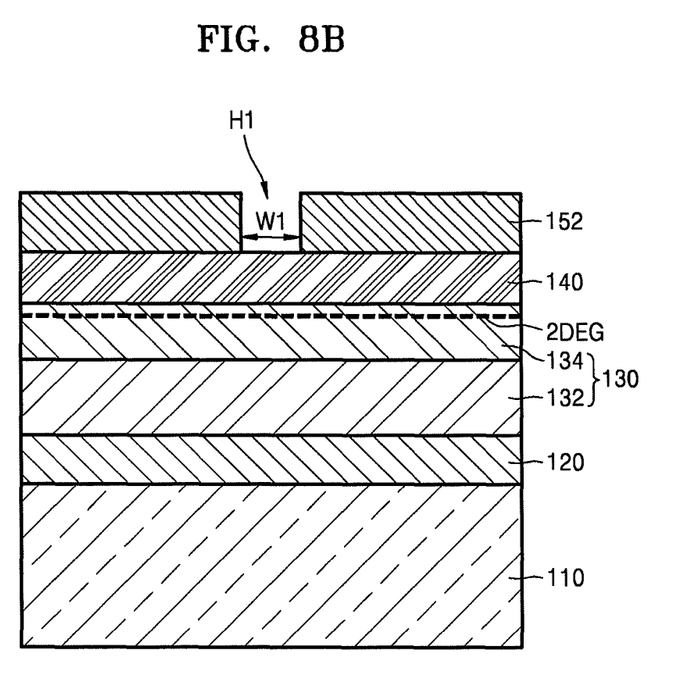

Referring to FIG. 8B, the first insulation layer 152 may be formed on the nitride-containing layer 140. The first insulation layer 152 may be formed of $SiO_x$ or $SiN_x$. A first hole H1 (corresponding to a portion at which the channel blocking layer 160 is to be formed) may be formed in the first insulation layer 152. The first hole H1 may expose a portion of the top surface of the nitride-containing layer 140. In an implementation, a width W1 of the first hole H1 may be, e.g., about 5 μm to about 10 μm.

By forming the first insulation layer 152 via a high-temperature deposition at a temperature equal to or above 1,000° C., surfaces of the nitride-containing layer 140 may be stabilized, thereby preventing current leakage due to surface defects of the nitride-containing layer 140.

Figure 8C:
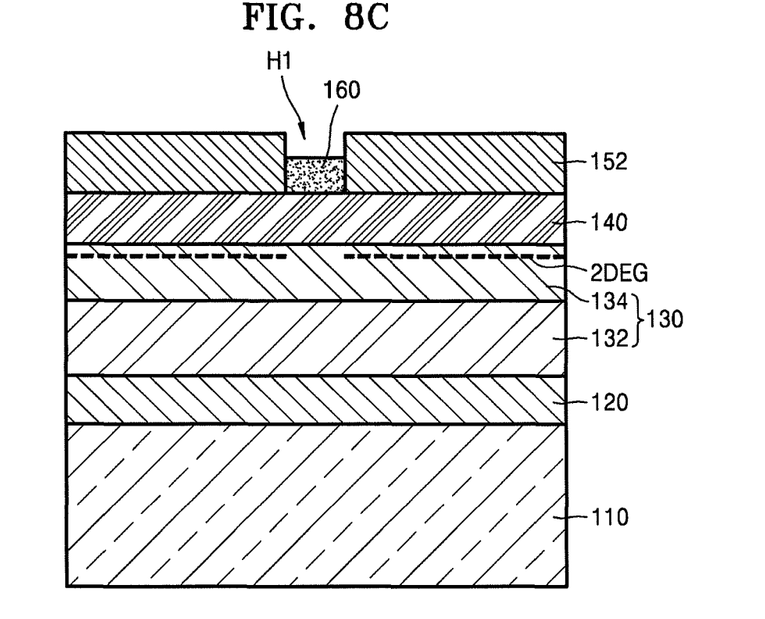

Referring to FIG. 8C, the channel blocking layer 160 may be formed in the first hole H1. The channel blocking layer 160 may be formed of, e.g., MgCN, via MOCVD, MBE, HVPE, or sputtering. In an implementation, the channel blocking layer 160 may also be formed of, e.g., MgN or CN, instead of MgCN. In an implementation, the thickness of the MgCN channel blocking layer 160 may be about 1 nm to about 100 nm, e.g., about 1 nm to about 50 nm. For example MgCN channel blocking layer 160 may have a thickness from about 0.5 μm to about 10 μm in correspondence to the width W1 of the first hole H1.

The MgCN channel blocking layer 160 may be formed via deposition or growth. For example, the channel blocking layer 160 may be formed by growing MgCN in-situ in a MOCVD equipment.

As the channel blocking layer 160 is formed, a 2DEG in the channel layer 134 may be blocked. Thus, a channel may be normally OFF. In FIG. 8C, a dotted line indicates that the 2DEG is discontinued below the channel blocking layer 160.

Figure 8D:
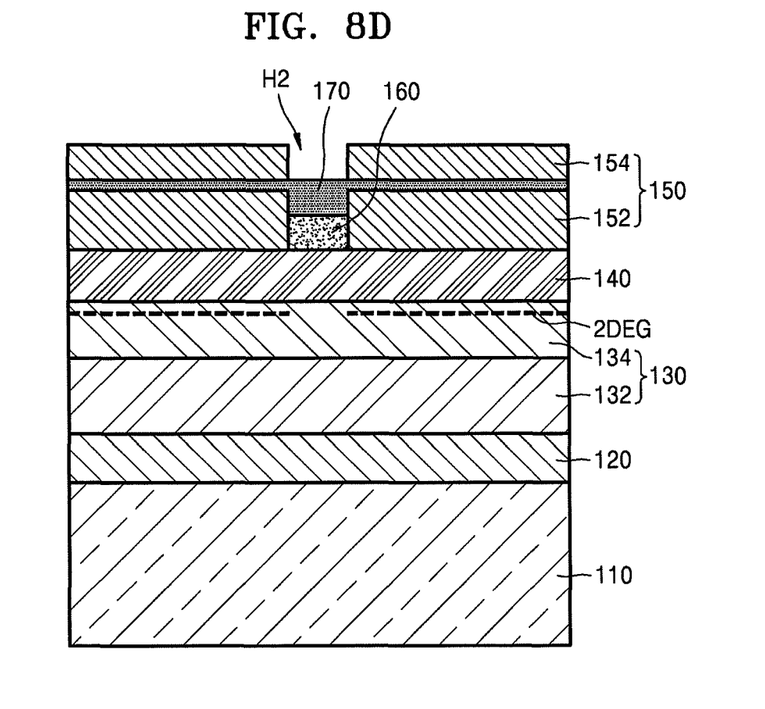

Referring to FIG. 8D, the gate insulation layer 170 may be formed on the channel blocking layer 160 and the first insulation layer 152. The gate insulation layer 170 may be formed of, e.g., $Al_2O_3$. The $Al_2O_3$ gate insulation layer 170 may be formed to have a thickness from about 20 nm to about 50 nm. Like the nitride-based semiconductor device 100b of FIG. 4, the gate insulation layer 170 may be formed to remain only on the channel blocking layer 160 via a patterning operation.

The second insulation layer 154 may be formed on the gate insulation layer 170. The second insulation layer 154 may help increase breakdown voltage and may be formed of $SiO_x$ or $SiN_x$. A second hole H2 for forming a gate electrode may be formed in the second insulation layer 154. The second hole H2 may expose a portion of the top surface of the gate insulation layer 170.

Figure 8E:
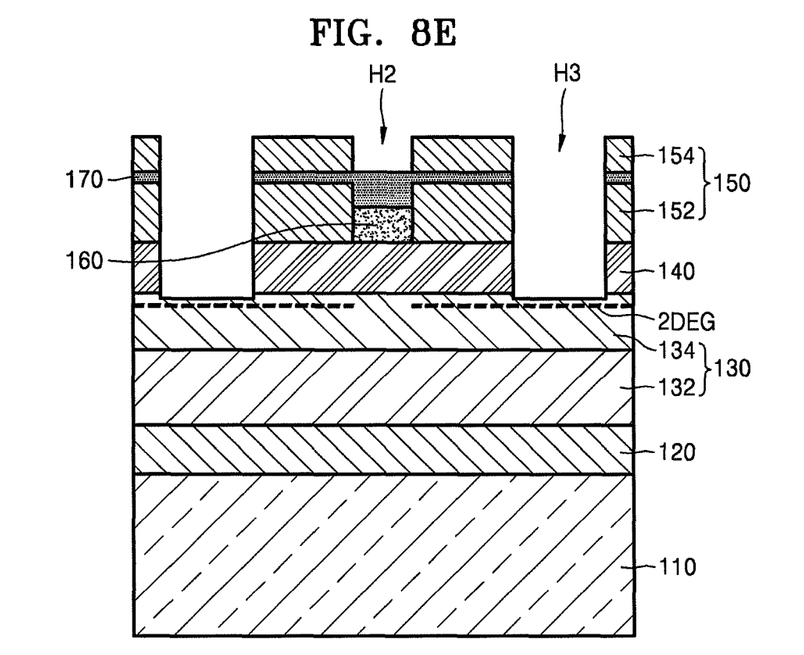

Referring to FIG. 8E, a third hole H3 for forming the source/drain electrodes 190 may be formed. The third hole H3 may penetrate through the second insulation layer 154, the gate insulation layer 170, the first insulation layer 152, and the nitride-containing layer 140, and may expose a portion of a 2DEG in the channel layer 134. In an implementation, the third hole H3 may be formed via, e.g., inductively coupled-plasma reactive ion etch (ICP-RIE).

Figure 8F:
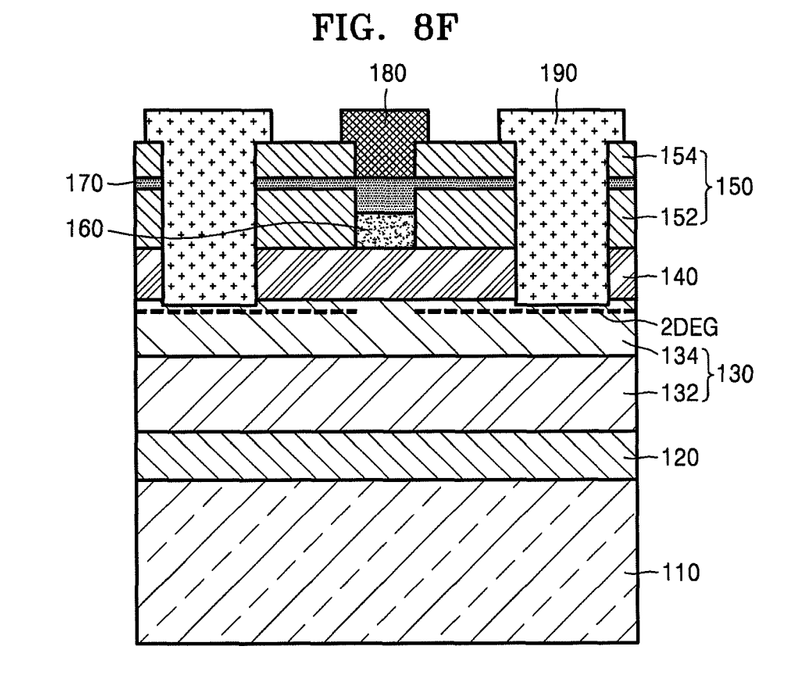

Referring to FIG. 8F, a metal may be deposited into the third hole H3 and may form the source/drain electrodes 190, which forms an ohmic-contact with the channel layer 134. The source/drain electrodes 190 may be formed of one or more materials selected from, e.g., Ni, Al, Ti, TiN, Pt, Au, $RuO_2$, V, W, WN, Hf, HfN, Mo, NiSi, $CoSi_2$, WSi, PtSi, Ir, Zr, Ta, TaN, Cu, Ru, Co, or combinations thereof. In the nitride-based semiconductor device 100 according to the present embodiment, the source/drain electrodes 190 may be formed by forming an ohmic contact between metals, e.g., Ta/Al/W/TiN, and the channel layer 134, and annealing the structure at a temperature of about 500° C. to about 550° C.

After the source/drain electrodes 190 are formed, a metal may be deposited into the second hole H2 to form the gate electrode 180. The gate electrode 180 may be formed of one or more materials selected from, e.g., Ni, Al, Ti, TiN, Pt, Au, $RuO_2$, V, W, WN, Hf, HfN, Mo, NiSi, $CoSi_2$, WSi, PtSi, Ir, Zr, Ta, TaN, Cu, Ru, Co, or combinations thereof. If the gate electrode 180 is formed without the gate insulation layer 170, the gate electrode 180 may be formed of a Schottky metal. For example, the gate electrode 180 may be formed of Ni/Au, $CuInO_2$/Au, ITO/Au, Ni/Pt/Au, or the like.

Figure 9:
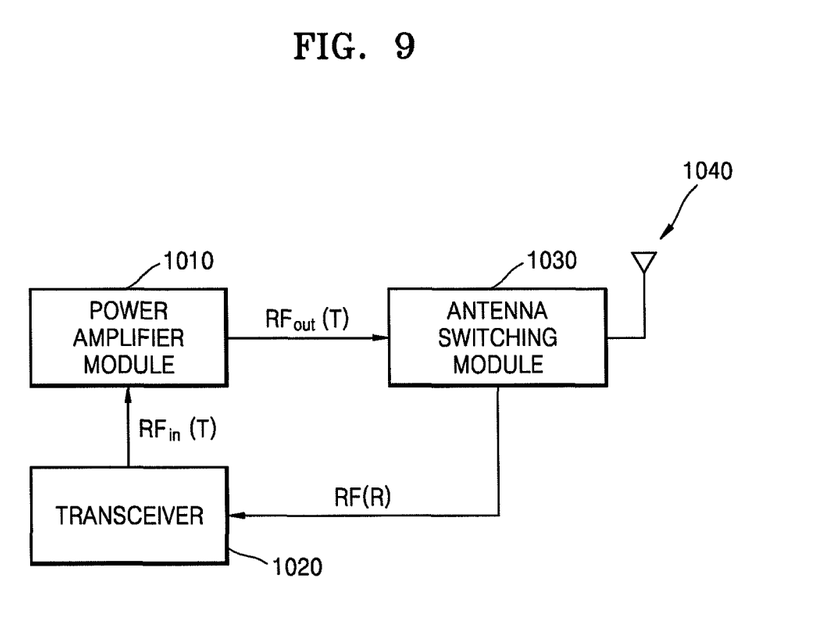
FIG. 9 illustrates diagram showing a power module system employing a nitride-based semiconductor device according to an embodiment.

FIG. 9 illustrates diagram showing a power module system 1000 employing a nitride-based semiconductor device according to an embodiment.

Referring to FIG. 9, the power module system 1000 may include a power amplifier module 1010, which includes one of the semiconductor devices 100, 100a, 100b, 100c, 100d, and 100e of FIGS. 1 and 3 through 7 as described above. The power amplifier module 1010 may be, e.g., a radio frequency (RF) power amplifier module.

The power module system 1000 may include a transceiver 1020 that is coupled with the power amplifier module 1010. The power amplifier module 1010 may receive a RF input signal (RFin(T)), and, to provide a RF output signal (RFout (T)), the RF input signal (RFin(T)) may be amplified. The RF input signals (RFin(T)), and the RF output signal (RFout(T)) may correspond to a transmitting mode of signals indicated by arrows.

The amplified RF output signal (RFout(T)) may be provided to an antenna switching module (ASM) 1030. The ASM 1030 may make OTA (over-the-air) transmission of RF output signals (RFout(T)) via an antenna structure 1040 easy. The ASM 1030 may receive RF signals (RF(R)) via the antenna structure 1040 and may couple the received RF signals (RF(R)) to a transceiver, where the RF signals (RF(R)) may correspond to the signal receiving mode.

According to an embodiment, the antenna structure 1040 may include one or more directional and/or omni-directional antennas. For example, the antenna structure 1040 may be a dipole antenna, a monopole antenna, a patch antenna, a roof antenna, or a microstrip antenna. Furthermore, structure of the antenna structure 1040 is not limited thereto, and the antenna structure 1040 may be any of various antennas suitable for OTA transmission or OTA reception.

The power module system 1000 may be a system including power amplification. For example, the power module system 1000 may be used for amplifying power at a high frequency and may be used for various purposes in various fields including personal mobile communication, satellite communication, radar system, telecommunication, medical apparatuses, or the like.

By way of summation and review, due to material limits of Si, there may be a limit in improving efficiency of a switching device. To overcome the material limits of Si, high electron mobility transistors (HEMT) may be used. A HEMT may include semiconductor layers having different polarization characteristics, where, in such a HEMT, a semiconductor layer having a relatively high polarization may induce a 2-dimensional electron gas (2DEG) in another semiconductor layer that is in a hetero-junction therewith. A 2DEG may be used as a channel between a drain electrode and a source electrode, and a current flowing in the channel may be controlled by a bias voltage applied to a gate electrode. A HEMT having a typical structure, which may use hetero junction based on a Group III nitride semiconductor, may have normally ON characteristics. Normally ON characteristics may result in large power consumption.

The embodiments may provide a nitride-based semiconductor device having normally OFF characteristics.

The embodiments may provide a nitride-based semiconductor device, which maintains normally OFF characteristics, is capable of improving simplification and reproducibility of processes, and is capable of maintaining ON resistance and a threshold voltage uniform.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A nitride-based semiconductor device, comprising:
a substrate;
a GaN-containing layer on the substrate;
a nitride-containing layer on the GaN-containing layer;
a channel blocking layer on the nitride-containing layer, the channel blocking layer including a nitride-based semiconductor;
a first insulation layer on the nitride-containing layer at two opposite sides of the channel blocking layer, the first insulation layer including $SiO_x$ or $SiN_x$;
a gate insulation layer on the channel blocking layer; and
a gate electrode on the gate insulation layer, wherein the gate insulation layer is on the channel blocking layer and the first insulation layer.

2. The nitride-based semiconductor device as claimed in claim 1, wherein the channel blocking layer includes $Mg_xC_{1-x}N$, in which $0 \leq x \leq 1$.

3. The nitride-based semiconductor device as claimed in claim 1, wherein the channel blocking layer has negative (−) charges and blocks a channel below the gate electrode via charge neutrality.

4. The nitride-based semiconductor device as claimed in claim 1, wherein the GaN-containing layer includes a semi-insulating layer and a channel layer.

5. The nitride-based semiconductor device as claimed in claim 4, wherein:
the semi-insulating layer is a GaN layer having a resistance sufficient to achieve a predetermined level of insulation, and
the channel layer is a doped GaN layer.

6. The nitride-based semiconductor device as claimed in claim 1, further comprising a buffer layer on the substrate.

7. The nitride-based semiconductor device as claimed in claim 1, wherein the substrate includes Si, $Al_2O_3$, SiC, MN, or GaN.

8. The nitride-based semiconductor device as claimed in claim 1, wherein the gate insulation layer includes $Al_2O_3$.

9. The nitride-based semiconductor device as claimed in claim 1, further comprising a second insulation layer on the gate insulation layer at two opposite sides of the gate electrode, the second insulation layer including $SiO_x$ or $SiN_x$.

10. The nitride-based semiconductor device as claimed in claim 1, further comprising source/drain electrodes, the source/drain electrodes:
being arranged apart from two opposite sides of the gate electrode,
penetrating through the nitride-containing layer, and
forming an ohmic contact with a 2-dimensional electron gas in the GaN-containing layer.

11. A nitride-based semiconductor device, comprising:
a substrate;
a buffer layer on the substrate;
a GaN-containing layer on the buffer layer;
a nitride-containing layer on the GaN-containing layer;
a channel blocking layer on the nitride-containing layer, the channel blocking layer including a nitride-based semiconductor;
a first insulation layer on the nitride-containing layer at two opposite sides of the channel blocking layer;
a gate insulation layer on the channel blocking layer and the first insulation layer;
a gate electrode on the gate insulation layer;
a second insulation layer on the gate insulation layer at two opposite sides of the gate electrode; and
source/drain electrodes, the source/drain electrodes:
being arranged apart from two opposite sides of the gate electrode,
penetrating through the nitride-containing layer, and
forming an ohmic contact with a 2-dimensional electron gas in the GaN-containing layer.

12. The nitride-based semiconductor device as claimed in claim 11, wherein the channel blocking layer is formed of $Mg_xC_{1-x}N$, in which $0 \leq x \leq 1$.

13. The nitride-based semiconductor device as claimed in claim 11, wherein the GaN-containing layer includes:
a semi-insulating layer formed as a GaN layer having a high resistance, and
a channel layer formed as a doped GaN layer,
wherein the gate insulation layer is formed of $Al_2O_3$, and
wherein the first insulation layer and the second insulation layer are formed of $SiO_x$ or $SiN_x$.

14. A nitride-based semiconductor device, comprising:
a substrate;
a semi-insulating layer on the substrate;
a channel layer on the semi-insulating layer;
a nitride-containing layer on the channel layer;
a channel blocking layer on the nitride-containing layer, the channel blocking layer including a nitride-based semiconductor;
a first insulation layer on the nitride-containing layer at opposing sides of the channel blocking layer, the first insulation layer including $SiO_x$ or $SiN_x$;
a gate insulation layer on the channel blocking layer; and
a gate electrode on the gate insulation layer, wherein the gate insulation layer is on the channel blocking layer and the first insulation layer.

15. The nitride-based semiconductor device as claimed in claim 14, wherein the device maintains a normally OFF state.

16. The nitride-based semiconductor device as claimed in claim 14, wherein the nitride-containing layer includes a semiconductor material having a different band gap from that of the channel layer.

17. The nitride-based semiconductor device as claimed in claim 14, wherein the channel layer includes a material that forms a 2-dimensional electron gas.

18. The nitride-based semiconductor device as claimed in claim 14, wherein the channel blocking layer includes $Mg_xC_{1-x}N$, in which $0 \leq x \leq 1$.

* * * * *